US006952143B2

(12) United States Patent
Kinayman et al.

(10) Patent No.: US 6,952,143 B2
(45) Date of Patent: Oct. 4, 2005

(54) MILLIMETER-WAVE SIGNAL TRANSMISSION DEVICE

(75) Inventors: Noyan Kinayman, Malden, MA (US); Allan S. Douglas, Tyngsboro, MA (US); John F. Cushman, Dracut, MA (US)

(73) Assignee: M/A-com, Inc., Lowell, MA (US)

( * ) Notice: Subject to any disclaimer, the term of this patent is extended or adjusted under 35 U.S.C. 154(b) by 0 days.

(21) Appl. No.: 10/628,635

(22) Filed: Jul. 25, 2003

(65) Prior Publication Data

US 2005/0017818 A1 Jan. 27, 2005

(51) Int. Cl.[7] .................................................. H03H 5/00
(52) U.S. Cl. ........................................ 333/26; 333/21 R
(58) Field of Search ................................. 333/26, 21 R, 333/22 R, 24.1, 33, 202; 330/66; 343/771; 385/94

(56) References Cited

U.S. PATENT DOCUMENTS 3,969,691 A * 7/1976 Saul .......................... 333/21 R
4,260,964 A * 4/1981 Saul ............................ 333/26
4,651,115 A * 3/1987 Wu ............................. 333/26
4,661,787 A * 4/1987 Lang ......................... 333/22 R
4,741,589 A * 5/1988 Halder et al. ................. 385/94
4,754,239 A * 6/1988 Sedivec ........................ 333/26
4,799,031 A * 1/1989 Lang et al. ............... 333/22 R
4,870,375 A * 9/1989 Krueger et al. ............... 333/33
5,600,286 A * 2/1997 Livingston et al. ........... 333/26
5,812,032 A * 9/1998 Stitzer ....................... 333/24.1
5,821,836 A 10/1998 Katehi et al.
6,040,739 A * 3/2000 Wedeen et al. ............... 330/66
6,087,907 A 7/2000 Jain
6,313,807 B1 11/2001 Kolak
6,396,363 B1 * 5/2002 Alexanian et al. ............ 333/26
6,573,803 B1 * 6/2003 Ziegner et al. ............... 333/26

FOREIGN PATENT DOCUMENTS

EP 0 883 328 A1 12/1998

OTHER PUBLICATIONS

Jui–Ching Cheng Ed—Institute of Electrical and Electronics Engineers: "A fast hybrid MoM/FEM technique for microstripline vertical couplers with multiple identical cavities" Jun. 22–27, 2003, vol. 4 of 4, pp. 1076–1079, XP010649967.

Jain N et al. Institute of Electrical and Electronics Engineers: "A Novel Microstrip Mode to Waveguide Mode Transformer and its Applications" May 2–25, 2001, vol. 2 of 3, pp. 623–626, XP001067356.

Patent Abstracts of Japan, vol. 2000, No. 07, Sep. 29, 2000 –& JP 2000 114802 A (Japan Radio Co Ltd), Apr. 21, 2000.

* cited by examiner

*Primary Examiner*—Patrick Wamsley

(57) ABSTRACT

A transition for transmitting a mm-wave signal from one plane to another, the transition comprising: (a) first and second transmission lines on parallel planes; (b) a third transmission line orthogonal to the first and second transmission lines, wherein either the first and second transmission lines are suitable for transmitting a TEM mode signal and the third transmission line is suitable for transmitting a waveguide mode signal, or the third transmission line is suitable for transmitting a TEM mode signal and the first and second transmission lines are suitable for transmitting a waveguide mode signal; and (c) first and second transducers, the first transducer coupled between the first and third transmission lines, the second transducer coupled between the second and third transmission lines, each of the transducers suitable for converting a TEM mode signal to a waveguide mode signal.

26 Claims, 4 Drawing Sheets

MILLIMETER-WAVE SIGNAL TRANSMISSION DEVICE

FIELD OF INVENTION

This invention relates generally to a millimeter-wave signal transition, and, more specifically, to a signal transition for transiting a mm-wave signal between two different geometric planes.

BACKGROUND OF INVENTION

Automated cruise control (ACC) for automobiles is gaining popularity in recent years. ACC allows a user to set the desired speed and minimum following distance of his/her vehicle. The system then controls the speed of the user's vehicle to ensure that the minimum following distance is maintained. Critical to such systems is the effective implementation of a radar system, typically those operating in the 77 GHz range. Such systems must be capable of transmitting, receiving and manipulating millimeter-wave (mm-wave) signals. As with most electronics, there is continuous pressure to miniaturize such systems to reduce their space and material requirements. Consequently, the circuitry of these systems is becoming more compact and sophisticated, employing such techniques as stack circuit technology to reduce size. With stacked circuits, there is often a need to transmit a signal between circuit substrates while operating in the mm-wave domain. For example, in ACC system applications, transreceiver and antenna are placed on either sides of a thick support plate. This makes it necessary to transmit the mm-wave signal between two microstrips on either side of the relatively thick metal support plate. This transmission is performed by a "signal transition" or "transition" as used herein. Design of this transition is critical to the overall system performance.

The purpose of a signal transition in an electrical circuit is to transfer the radio frequency (RF) energy from one point to another point with minimum interference and loss. The key requirements of a good signal transition are high return loss and low insertion loss. Note that, in general, these two specifications are independent from each other, but must be satisfied simultaneously. In other words, one may achieve a relatively good return loss using a particular signal transition, however, without having a low insertion loss, mm-wave energy is absorbed in the transition, thereby diminishing the total performance of the system. Having a low insertion loss is especially important in high frequencies due to increased conductor and radiation losses.

Transitions designed to transfer electrical signals from transverse plane of microstrip lines to another plane, which is parallel to the first one, with a vertical connection are now going to be explained in more detail because the invention is related with such structures. Via holes employed in standard multi-layer printed circuit board (PCB) technology are very good examples of such transitions. The critical issue here is the electrical length of the vertical connection. As the length of vertical connection increases, design of the transition becomes more challenging because of the increased parasitic inductance. There are a number of reported developments for transferring a signal from one transverse plane to another one. For example, the microstrip-to-slot transition along with its variants which use a vertical waveguide section is one of the more commonly used techniques for this purpose. This approach, however, has a number of disadvantages. First, this transition relies on the resonance phenomenon to achieve a good match. Therefore it is particularly susceptible to geometry variations in the transition. Additionally, since the transition has no back short, it suffers from relatively high insertion loss due to radiation. This is especially important because the spurious radiations that may occur in such a transition may increase the cross talk or affect the antenna pattern in a mm-wave system. Alternatively, a transition can be used which exploits an E-plane probe with a back short to transfer the energy through a waveguide section. Although this approached is well established in the literature, it has a significant disadvantage in mm-wave frequencies. Specifically, at these frequencies, one must position a back short over a microstrip probe within a tolerance in the order of sub-millimeters in a 77 GHz application. This is clearly an expensive procedure for a high volume manufacturing.

Therefore, there is a need for a mm-wave transition to overcome the aforementioned difficulties. The present invention fulfills this need among others.

SUMMARY OF INVENTION

The present invention provides a mm-wave signal transition which overcomes the problems of the prior art. Specifically, the transition of the present invention uses a transducer to convert signals between transverse electromagnetic (TEM) and waveguide modes, rather than relying on the precise positioning of a transmission line relative to a waveguide to launch a signal down the waveguide. By using a transducer, the sensitive signal conversion between TEM mode and waveguide mode is performed in a single, modular unit, which lends itself to mass manufacturing using well-known techniques. Once the delicate operation of converting a signal between TEM and waveguide modes is performed, the converted signal can be transmitted to an orthogonally positioned transmission line or waveguide with relative ease. If desired, the signal can then be converted back to either a TEM mode or waveguide mode signal for transmission down a different orthogonally positioned transmission line or waveguide. This allows the signal to be transmitted over various types of transmission lines over relatively large distances between circuits with efficiency.

This approach offers a number of advantages over prior art approaches with respect to both manufacturing and performance. As mentioned above, since the TEM/waveguide mode conversion is performed in a transducer, which can be manufactured discretely using well-known techniques, the need for close tolerance positioning between the other components of the transition is alleviated, thereby facilitating large-scale manufacturing techniques and modularization. For example, the waveguide need not be precisely aligned with the transition line, but may instead be based on a relatively loosely toleranced borehole through a support plate. This borehole may be adapted to receive a separately manufactured, modular waveguide filler to aid in the propagation of the waveguide mode signal. Additionally, by converting the TEM/waveguide mode in a modular transducer, there is no need to interconnect probes or the like through soldering or other welding techniques which are time-consuming and prone to failure or performance variations. The transducer not only simplifies the assembly of the transition, but also, in its preferred embodiment, it is planar and eliminates the need for back short, thereby simplifying its own manufacture. Therefore, the present invention's exploitation of a transducer in a transition offers significant manufacturing benefits over the prior art.

In addition to the manufacturing benefits of the present invention, it also offers important performance advantages over the prior art. Specifically, by converting between TEM and waveguide modes in a relatively simple, modular unit, a complex assembly of components is eliminated along with its attendant inefficiencies and variances. This results in a transition that provides consistent performance with both low insert loss and low reflective loss. Additionally, since the signal transition between orthogonal transmission lines is performed by converting the mode of the signal, the distance over which signals may be communicatively connected to parallel transmission lines is limited by the loss of the vertical hollow-waveguide which can be relatively low. This is in stark contrast to many prior art devices which experience difficulty in transmitting mm-wave signals between parallel transmissions that are further than 10% of the operating signal's wavelength. Finally, since the transition does not use probes or similar antennas like devices to launch the signal into the waveguide, radiation losses are very low and there is no need for a back short.

Accordingly, one aspect of the present invention is a transition for transmitting a mm-wave from one plane to another plane using a transducer. In a preferred embodiment, the transition comprises: (a) first and second transmission lines on parallel planes; (b) a third transmission line orthogonal to the first and second transmission lines, wherein either the first and second transmission lines are suitable for transmitting a TEM mode signal and the third transmission line is suitable for transmitting a hollow waveguide mode signal, or the third transmission line is suitable for transmitting a TEM mode signal and the first and second transmission lines are suitable for transmitting a waveguide mode signal; and (c) first and second transducers, the first transducer coupled between the first and third transmission lines, the second transducer coupled between the second and third transmission lines, each of the transducers being suitable for converting a signal between TEM and hollow waveguide modes.

Another aspect of the present invention is a method for transmitting a mm-wave signal from a first plane to a second plane using a transition comprising a transducer. In a preferred embodiment, the method comprises: (a) transmitting a mm-wave signal along a first transmission line in a first plane; (b) converting the signal from one mode of either a TEM mode or a waveguide mode to the other mode of either the TEM mode or the waveguide mode using a transducer; (c) transmitting the signal along a third transmission line orthogonal to the first transmission line in the other mode to a second plane parallel to the first plane; (d) converting the signal back to the one mode; and (e) transmitting the signal in the one mode along a second transmission line in the second plane.

Another aspect of the present invention is a method of manufacturing a transition which lends itself to large-scale manufacturing. In a preferred embodiment, the method comprises: (a) providing a support plate; (b) boring a hole in the support plate to form the waveguide; (c) inserting a waveguide filler in the hole; (d) providing first and second mm-wave boards, each board comprising an integrated transmission line and a transducer having a waveguide portion; (e) affixing the first and second mm-wave boards to each side of the support plate such that the transition lines are orthogonal to the waveguide and that the waveguide is axially aligned with the waveguide portion of each transducer.

Yet another aspect of the invention is a system incorporating the transition of the present invention. In a preferred embodiment, the system comprises an ACC system with the transition described above.

DETAILED DESCRIPTION OF PREFERRED EMBODIMENT

Figure 1:
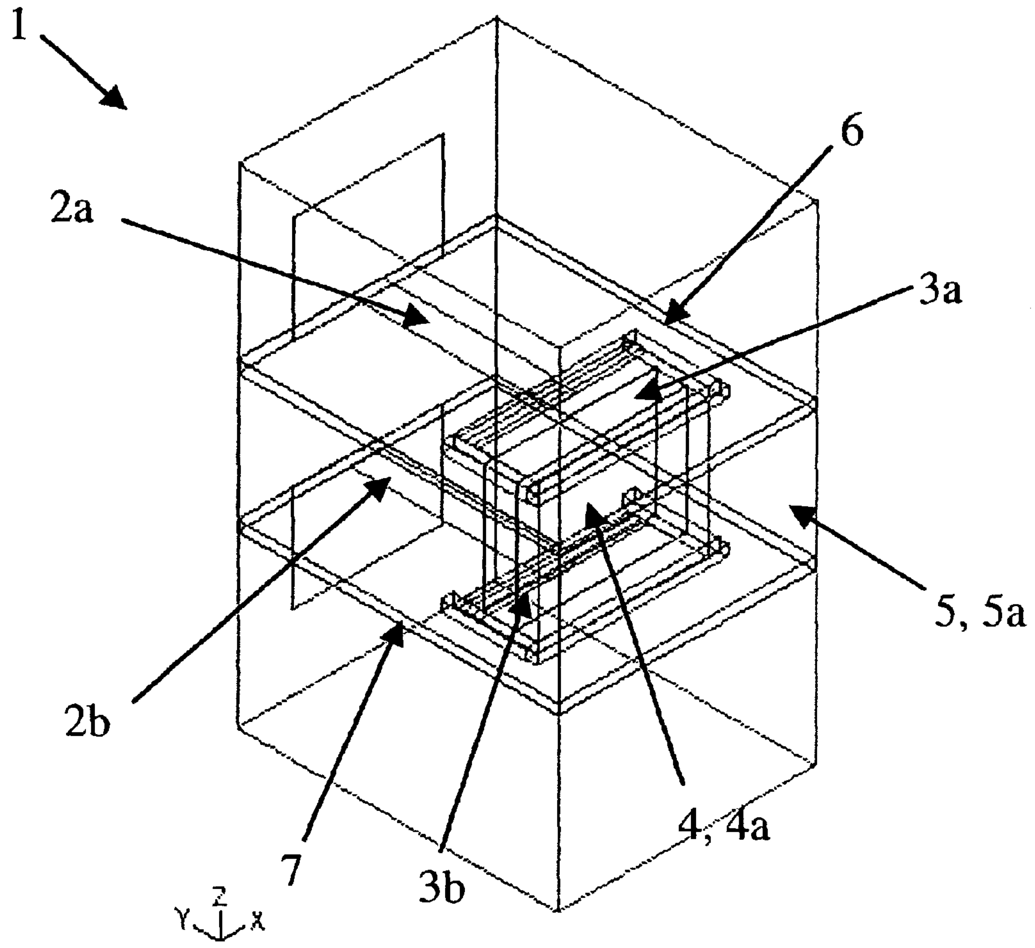
FIG. 1 shows a preferred embodiment of the transition of the present invention.

Referring to FIG. 1, a preferred embodiment of the signal transition 1 of the present invention is shown. As used herein, the term "transition" refers to any device either integral, integrally-molded or an assembly of discrete components which is used to transmit a mm-wave signal from one transverse plane to another one. As used herein, the term "mm-wave signal" refers to a high-frequency electrical signal which may be propagating in a number of different forms, including, for example, in a transverse electromagnetic (TEM) mode or in a waveguide mode. As used herein, the term "TEM mode" refers collectively to both a true TEM pattern and a quasi-TEM pattern. The concepts of TEM, quasi-TEM, and hollow waveguide fields are well known and will not be addressed specifically herein. Suffice it to say though, that in a true TEM mode the electrical field, the magnetic field and the direction of wave travel are all orthogonal to each other, while in a quasi-TEM mode, the electrical field, the magnetic field and the direction of wave travel are generally orthogonal to each other although there are small longitudinal electric and magnetic fields components. The term "hollow waveguide mode" as used herein refers to a mode in which electromagnetic energy propagates in a waveguide. The term hollow is employed to indicate that the waveguide does not have a center conductor as in coaxial waveguides. However, it may have a dielectric filling to alter the propagation properties. Therefore, this type of waveguide cannot support TEM mode propagation. Hollow waveguide modes are well known and depend on the type of waveguide through which the signal is intended to travel. For example, a fundamental mode for a rectangular waveguide is the $TE_{10}$ mode, while the fundamental mode for a circular waveguide is a $TE_{01}$ mode.

Transition 1 comprises first and second parallel transmission lines 2*a*, 2*b*, and a third transmission line 4 orthogonal to the first and second transmission lines 2*a*, 2*b*. In this particular embodiment, the first and second transmission lines are incorporated into first and second mm-wave boards 6, 7, which are on different transverse planes. The first and second transmission lines 2*a*, 2*b* are suitable for transmitting a signal having a TEM mode, while the third transmission line 4 is a waveguide 4*a* disposed in a support plate 5 and is suitable for transmitting a signal in a waveguide mode. The transition 1 also comprises first and second transducers 3*a*, 3*b* on the first and second mm-wave boards 6,7, respectively. The first transducer 3*a* is coupled between the first and third transmission lines 2*a*, 4, while the second transducer 3*b* is coupled between the second and third transmission lines 2*b*, 4. Each of the transducers converts a signal between a TEM mode and a waveguide mode. These components are considered below in greater detail.

In the embodiment of FIG. 1, the first and second transmission lines 2*a*, 2*b* of the present invention are suitable for transmitting TEM mode signals to and from the first and second transducers 3*a*, 3*b*, respectively, while the third transmission line 4 is a waveguide 4*a* suitable for transmitting a waveguide mode signal between the transducers. It is within the scope of the invention, however, that functionality of the transmission lines be reversed and that the first and second transmission lines are instead waveguides, while the third transmission line is a general transmission line suitable for supporting a TEM mode signal between the two transducers. The particular configuration of the transmission lines depends upon the desired application. For example, the former is generally preferred in assemblies used in ACC systems due to the anticipated incorporation of the first and second transmission lines into other circuitry used for the generation, receipt and manipulation/interpretation of the signal because microstrip lines (i.e., quasi-TEM waveguide) are used to carry RF signals in such systems. For purposes of illustration, this discussion will focus on the embodiment in which mm-wave signals are transmitted between parallel transmission lines using a waveguide.

Transmission lines for transmitting TEM and waveguide mode signals are well known. Examples of transmission lines for transmitting TEM signals include coaxial lines, striplines, microstrip lines, coplanar waveguides (CPW), and fin strips. Preferably, at least one of the transmission lines suitable for transmitting TEM signals is a coplanar transmission line, specifically, a microstrip. More preferably, both the first and second transmission lines are microstrips.

Figure 2:
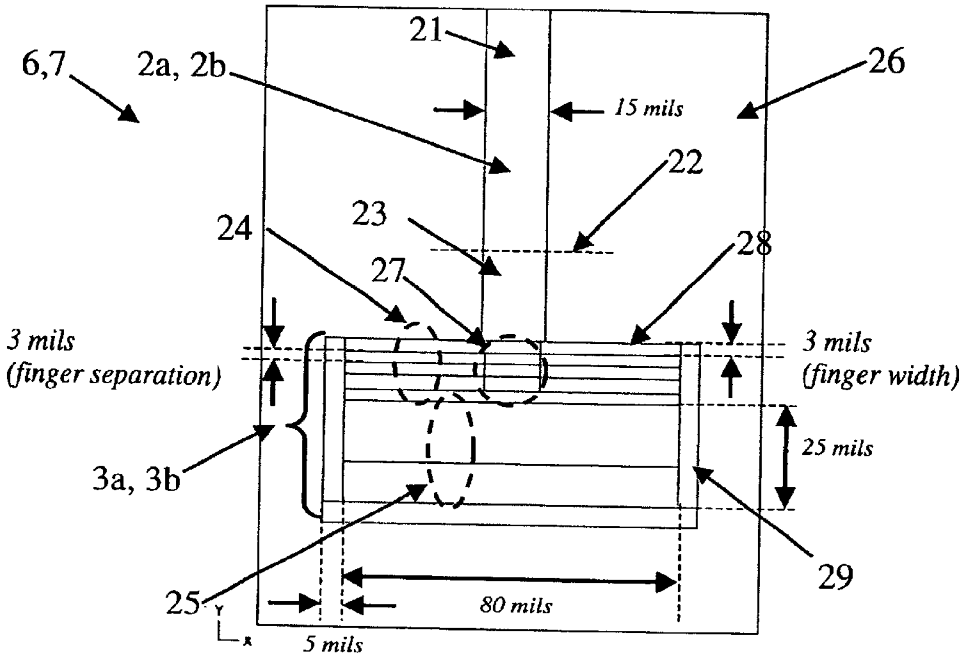
FIG. 2 shows the substrate of the transition of FIG. 1.

Referring to FIG. 2, the first mm-wave board 6 is shown comprising the first transition line 2*a* and the first transducer 3*a*. Preferably, but not necessarily, the second mm-wave board 7, which comprises the second transmission line 2*b* and second transducer 3*b*, is identical to the first mm-wave board such that one mm-board configuration may be used for both planes. The first transmission line 2*a* is embodied as a microstrip 21. As mentioned above, the configuration of a microstrip is well known and comprises a conductive path 21 printed onto the first substrate 26. When incorporated in an ACC system or other mm-wave based system, the conductive path 21 connects or couples external circuitry to the transition 1. The short length of conductive path 21, therefore, may be an extension of a transmission line carrying a communications signal to or from the external circuitry on the mm-wave board or a separate circuit board.

The microstrip may comprise any known conductor such as copper, gold, silver or aluminum. The dimensions of the microstrip can vary depending upon the application and the material used. The width of the microstrip line depends on the characteristic impedance required. For example, on a 5 mils thick Duroid 5880 material, which has the dielectric constant of 2.2, the 50-Ohm microstrip transmission line is 15 mils wide.

The substrate 26 may be any structure that provides a platform for supporting the conductive path 21. Preferably, the substrate is also suitable for supporting other electrical and optical components such as the transducer. The conductive path 21 and other components may be mounted in or on the substrate or may be integrally formed or integrated with the substrate. As a matter of convention, when referring to a component's position with respect to a substrate, the terms "on," "in," "incorporated into," and "integrally-formed" are used interchangeably throughout this disclosure. Preferably, the substrate 26 is rigid to provide a stable platform for the electrical components affixed thereto, although flexible substrates are contemplated herein as well. Additionally, the substrate is preferably, although not necessarily, planar.

Aside from its physical configuration, the substrate is often an integral component of a transmission line or transducer, and, thus, its electrical properties may be critical. Suitable materials for the substrate include dielectrics having a dielectric constant between about 2 and 10. Examples of suitable materials include ceramics such as Alumina, single crystal semiconductors such as Gallium Arsenide and Silicon, single crystal sapphire, glass, quartz, and plastics such as Teflon®. Satisfactory results have been obtained with a substrate of Duroid® 5880 (a Teflon based material, commercially-available through Rogers Corporation) which has an effective dielectric constant of 2.2.

The substrate should be adequately dimensioned to provide a sufficient base for the first conductive path 21, and, preferably, the first transducer 3*a*, although it should be understood that the transducer and transmission lines may be supported by discrete substrates and coupled via an additional transition suitable for coupling TEM mode signals between different transmission lines on the same plane (well known). One of ordinary skill in the art can determine the appropriate thickness for a particular substrate material.

In the embodiment shown in FIG. 1, the third transmission line 4 is a waveguide 4*a* for transmitting the signal in a waveguide mode. Waveguides are well known and include hollow, solid and filled waveguides of all shapes and cross-sectional areas and lengths. Preferably, the waveguide is a filled rectangular waveguide given its relative ease of manufacturing. Those of ordinary skill in the art will appreciate, however, that although a rectangular waveguide is described herein, the invention also applies to waveguides with cross-sectional geometries that are not rectilinear, such as, for example, circular cross sections.

Referring to FIG. 1, the waveguide is a hollow rectangular waveguide defined by a tunnel or bore hole through the support plate 5. In addition to defining the waveguide, the support plate 5 may be desirable to add rigidity of the assembly and make it more robust. For example, in the embodiment shown in FIG. 1, the support plate 5 comprises a relatively think, rigid material, such as a metal plate 5*a*, for supporting the first and second mm-wave boards 6, 7.

Figure 3:
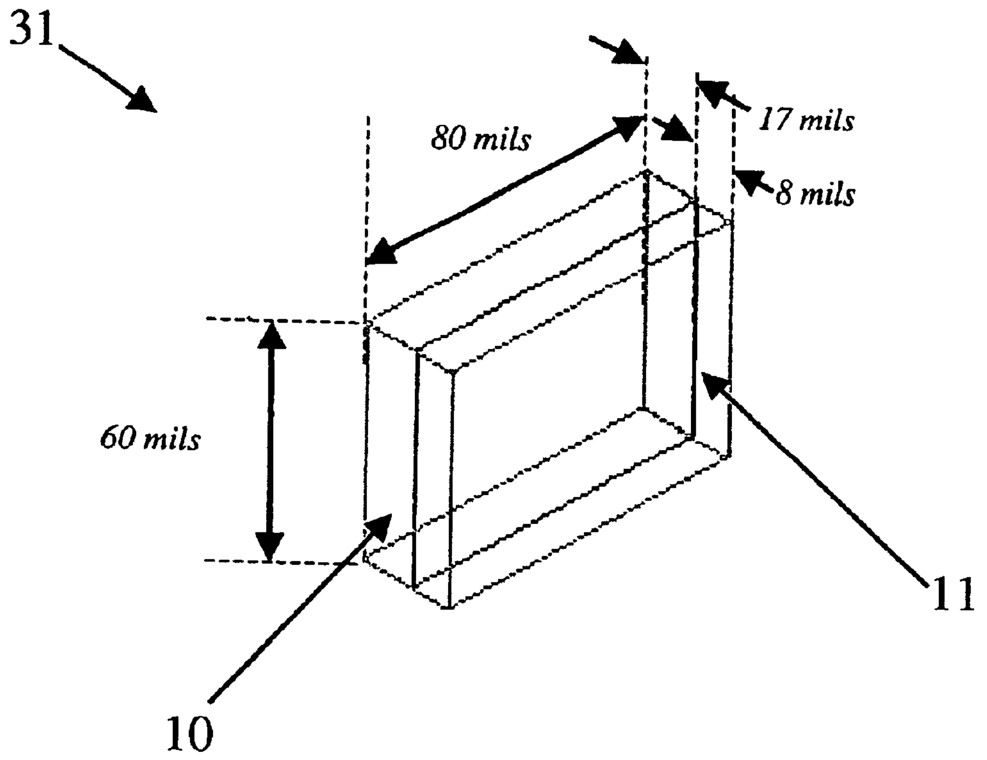
FIG. 3 shows the waveguide filler for the transition of FIG. 1.

In the embodiment shown in FIG. 1, the borehole is filled with a separately prepared dielectric substrate filling 31 with rectangular cross-section as shown in FIG. 3. This dielectric substrate filling 31 has a thick metal backing 10 and a dielectric material 11. The dielectric material used in the filling 31 can be selected from a wide range of materials. Suitable materials tend to have a dielectric constant of about 2.2 to about 12.9, and a loss tangent of about 0.001 to about 0.01. Examples of suitable materials include ceramic, Teflon, GaAs, and Silicon, which are the commonly used mm-wave board materials or substrates for monolithic microwave circuits. For example, suitable results have been achieved using Alumina which has a dielectric constant of 9.6 and a loss tangent of 0.001. For this application, the backside metalization of the boards should be relatively thick. For example, suitable results have been achieved using 17 mils of aluminum material and 8 mils of Alumina. The important point is to select proper dielectric thickness to match the characteristic impedance of the waveguide portion of transducer 4 (discussed below). This can be easily achieved using a full-wave electromagnetic simulator.

After determining the thickness of the dielectric and the backside metallization of the filling material through the design process, they are cut in the shape of rectangular prisms to form the completed dielectric substrate filling 31 and dropped into the rectangular opening previously prepared in the metal plate 5*a*. This way, a rectangular dielectric-filled waveguide 4 is formed in the metal plate 5*a*, which is used to transfer the mm-wave energy from one side of the metal plate 5*a* to the other side.

The length of waveguide 4 may be as thick as the support plate 5 or the vertical distance between the first and second transmission lines 2*a*, 2*b*. This means that the waveguide may have a length which is greater than 10% of the wavelength of the mm-wave signal. For example, if the wavelength is 2.8 mm (77 GHz), the length may be greater than 0.28 mm. Such lengths have proven problematic in the prior art, however, since the present invention employs a filled waveguide section to transfer the mm-wave energy, it is possible to transfer the energy through thicker support plates with relatively low loss. In a preferred embodiment, the length of waveguide section is at least 0.25 mm, more preferably, at least 1 mm, and, even more preferably, at least 1.5 mm.

The first and second transducers 3*a*, 3*b* serves to convert the signal between the TEM mode and waveguide mode. The concept of using a transducer is discussed generally in U.S. Pat. No. 6,087,907 which is hereby incorporated by reference. Referring to FIG. 2, the first transducer 3*a* is considered in detail with respect to the first mm-wave board 6, although it should be appreciated that the second transducer 3*b* is preferably identical to the first transducer, and thus, the discussion herein applies to the second transducer as well.

For illustrative purposes, the first transducer 3*a* may be separated into three different portions: the transmission portion 23, the conversion portion 24 and the waveguide portion 25. The transmission portion 23 of the transducer 3*a* is electrically coupled to the conductive path 21 of the first transmission line 2*a*. It should be understood that the transducer and transmission line may be printed on the same substrate as the transmission line and consequently a clear line of demarcation between the two may not exist. Nevertheless, for purposes of discussion herein suffice it to say that, at some point 22 (perhaps hypothetical), the conductive path 21 is no longer part of the transmission line 2*a* but rather part of the transmission portion 23 of the transducer 3*a*.

The transmission portion 23 is connected to the conversion portion 24. The conversion portion 24 comprises a plurality of conductive converting fins 28 printed onto the first substrate 26. The use of fins minimizes the reflective loss of the transducer. Each fin 28 is disposed in perpendicular relation to the direction of TEM mode propagation. In the embodiment shown in FIG. 2, each fin 28 is positioned co-linear with its pair fin and on opposite sides of a conversion trace 27 which is axially aligned with the TEM axis. In this embodiment, there are four pairs of converting fins 28. Each fin 28 is equal to or greater than one-quarter wavelength of the operating frequency in length where the length of the fin is defined from the TEM axis to the end of each fin. For example, in the present embodiment, the central operating frequency is 77 GHz. One quarter of a wavelength of microstrip in Duroid® substrate having a dielectric constant of 2.2 at a central operating frequency of 77 GHz is, therefore, approximately 40 mils. Accordingly, a width of the conversion portion 24 using fins 28 on opposite sides of the conversion trace 27 is approximately equal to or greater than 80 mils total. Alternative embodiments also include fewer pairs of fins 28 as well as additional pairs of fins 28 or transmission lines comprising the conversion portion 24 depending upon the desired electrical performance.

In operation, it can be thought that the fins 28 electrically behave as transmission lines. At the operating frequency, the appropriate length of the transmission line electrically creates what appears to be an open circuit near, but away from the center of the TEM axis by virtue of the approximately one-quarter wavelength dimension. The transmission line, however, may also be emulated using a lumped element equivalent circuit instead of the fin 28, for example a parallel inductor and capacitor combination having appropriate values at the operating frequency. In alternate embodiments, it is not necessary that the fins 28 in each pair be co-linear with each other or that there be an equal number of fins 28 on either side of the conversion trace 27. Modifying these characteristics, however, will vary performance characteristics. These characteristics, therefore, may be used to optimize performance of the transformer for specific applications.

The conversion portion is adjacent the waveguide portion 25 of the transducer 3*a*. The waveguide portion 25 comprises the first substrate 26 and a U-shaped conductive barrier 29 defining a portion of the first waveguide's perimeter. The barrier 29 may be formed in known ways including etching or machining a trench or series of recessions in the substrate and filling or lining the trench or recessions with a conductive material such as, for example, gold, silver, copper, or aluminum. Rather than forming a continuous trench in the substrate, it may be preferable to use closely spaced circular vias to approximate a trench wall. Such an approach may be preferred for a printed circuit board. However, a continuous trench would improve the isolation between the neighbor transitions significantly.

A waveguide mode signal is launched into the waveguide portion by the conversion portion. Specifically, since adjacent fins 28 are electrically close together, the currents flowing through the fins are approximately in phase. The currents through the fins induce magnetic and electric fields that interfere destructively in air, but interfere constructively in the dielectric. Most of the energy, therefore, is transferred into the first substrate 26 of the waveguide portion 25.

The specific configuration of the transducer and the waveguide may be determined using commercially available full-wave electromagnetic simulators. For example, the design process may employ a simulation and optimization of appropriately portioned structures using a full-wave 3D electromagnetic simulator, available though, for example, Ansoft HFSS. The optimization feature of the simulator allows one to vary the dimensions of the transition for different material properties, sizes, and operating frequencies.

Referring to FIGS. 1 and 2, the operation of the transition 1 is now considered. The TEM mode signal is carried by the first transmission line 2*a* to the transmission portion 23 of the first transducer 3*a*. In the transducer, the signal is converted to a waveguide mode, in particular, a $TE_{10}$ mode, for launching into a rectangular waveguide portion 25 of the first transducer 3*a* formed in the first substrate 26. Then, the signal propagating through the waveguide portion 25 of the first transducer 3*a* is transferred to the third transmission line 4, the waveguide 4*a*, via a waveguide junction. After the mm-wave signal passes through the waveguide 4*a*, it is coupled to a waveguide portion (not shown) of the second transducer 3*b* on a second substrate and is converted back to a TEM mode signal and transmitted to the transmission portion (not shown) of the second transducer 3*b*. The TEM mode signal is finally coupled to the second transmission line 2*b* which is parallel to the first transmission line 2*a*. This completes the transfer of the mm-wave signal from the first transmission line 2*a* to the second transmission line 2*b*.

It should be understood that although the function of the transducer was described above with respect to the transducer converting a TEM mode signal inputted into its transmission portion to a waveguide mode signal which is outputted through its waveguide portion, the transducer may work in reverse as well. Specifically, in the preferred embodiment, the same transducer can be used to convert a waveguide mode signal inputted into its waveguide portion to a TEM mode signal which is outputted through its transition portion.

As mentioned above, the configuration of the transition of the present invention provides for improved manufacturability. Specifically, the design avoids the close tolerances required in prior art transitions such as, for example, microstrip-to-slot and E-plane probe transitions. By relying on a transducer to convert the signal between TEM and waveguide modes, the conversion is effected in a modular component and complex alignment between components and waveguides can be avoided. Consequently, production methods can be used which lend themselves to volume and automated assembly. In particular, since the transmission line to waveguide position is not critical, the waveguide can be made separately from the transition—that is, it does not need to be formed integrally with the transition. This allows it to be manufactured using high-volume manufacturing techniques. For example, in the embodiment shown in FIG. 1, the waveguide in formed in the support plate 5, the metal base plate 5*a*, by first boring an opening in the substrate corresponding to the cross-section area of the waveguide. In the preferred embodiment, the waveguide is rectangular and, hence, the opening is rectangular. The dimensions of this rectangular section are larger than the required dimensions for the waveguide section of the transition. However, the actual waveguide function is formed by a separately prepared metalized dielectric which is dropped into this opening. The reason for initially preparing a larger opening in the base is to facilitate high-volume manufacturing requirements because it would be extremely difficult to machine the actual waveguide dimensions directly into the metal plate due to low tolerance requirements.

Figure 4A:
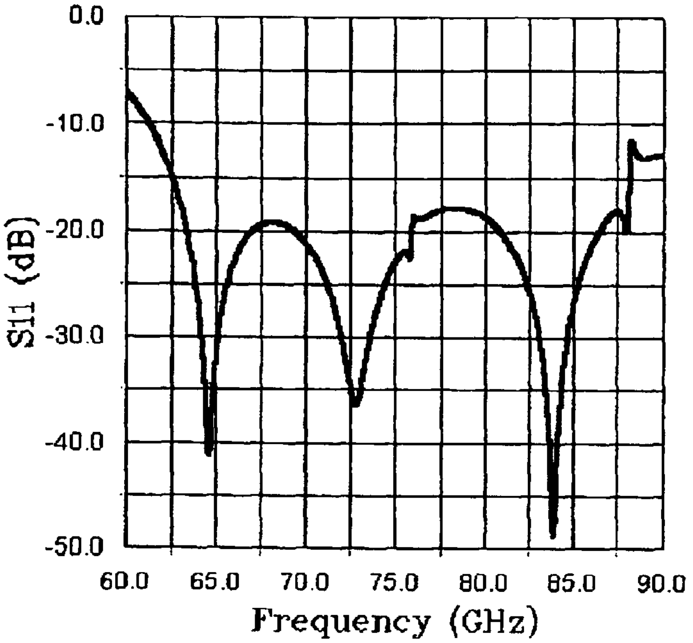
FIGS. 4*a* and 4*b* show performance data for the transition of FIG. 1.
Figure 4B:
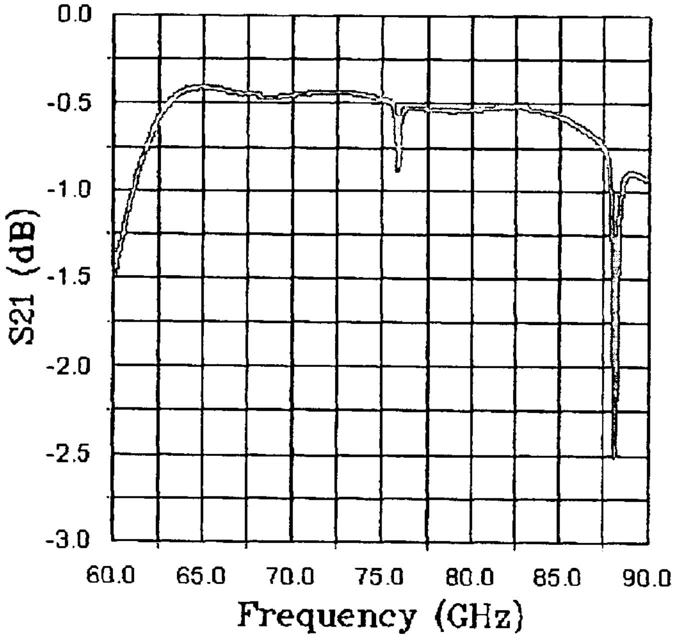

The transition of the present invention not only lends itself to high-volume manufacturing techniques, but also offers improved performance. For example, referring to FIG. 4, the simulated response of the mm-wave transition of FIG. 1 is shown. Note that the reflection loss of the transition is better than 15 dB between 65 and 85 GHz. The insertion loss is better than 0.6 dB in the same frequency range.

The transition of the present invention may be utilized in any assembly in which a mm-wave signal is transferred from one plane to another plane. Examples of such assemblies include ACC systems, LMDS systems and HRR systems.

What is claimed is:

1. A transition for transmitting a mm-wave signal from one plane to another, said transition comprising:

first and second transmission lines on parallel planes;

a waveguide orthogonal to said first and second transmission lines, wherein said first and second transmission lines are suitable for transmitting a TEM mode signal and said waveguide is suitable for transmitting a waveguide mode signal;

a support plate between said first and second transmission lines, said support plate defining a borehole with conductive walls between said first and second transmission lines;

a metalized dielectric filler comprising at least one conductive layer and being disposed in said borehole such that said conductive layer and at least a portion of said conductive walls of said borehole form said waveguide, whereby said waveguide is smaller than said borehole.

2. The transition of claim 1, further comprising first and second transducers, said first transducer coupled between said first transmission line and said waveguide, said second transducer coupled between said second transmission line and said waveguide, each of said transducers having a conversion portion comprising one or more fins perpendicular to its respective transmission line and being suitable for converting a signal between a TEM mode and a rectangular waveguide mode having a waveguide portion adjacent said waveguide to facilitate coupling of a signal in said rectangular waveguide mode between said waveguide and the transducer.

3. The transition of claim 2, wherein each transducer comprises:

a transmission portion connected to its respective transmission line; and said waveguide portion being configured to facilitate the propagation of a waveguide mode signal therethrough in a plane orthogonal to the transmission portion.

4. The transition of claim 3, wherein said transmission portion, said waveguide portion, and said conversion portion share a common substrate.

5. The transition of claim 4, wherein said waveguide portion comprises a conductive barrier defined in said substrate.

6. The transition of claim 5, wherein said conductive barrier is a metallic wall.

7. The transition of claim 5, wherein said conductive barrier is a perforated metallic wall.

8. The transition of claim 3, wherein said metalized dielectric filler has an impendence which matches that of said waveguide portion.

9. The transition of claim 2, wherein said first and second transmission lines and said first and second transducers are disposed on first and second mm-wave boards; respectively.

10. The transition of claim 9, wherein said mm-wave boards are overlapping.

11. The transition of claim 10, wherein said mm-wave boards are separated by a distance of at least 10% of an operating signal wavelength.

12. The transition of claim 9, wherein at least one of said mm-wave boards comprises electrical circuitry.

13. The transition of claim 2, wherein said first transducer converts a TEM mode signal to a rectangular waveguide mode signal and said second transducer converts a rectangular waveguide mode-signal to a TEM mode signal.

14. The transition of claim 13, wherein said rectangular waveguide mode signal is a $TE_{10}$ mode signal.

15. The transition of claim 2, wherein said first and second transducers are identical.

16. The transition of claim 1, wherein said first or second transmission line is a microstrip.

17. The transition of claim 1, wherein said waveguide is a rectangular waveguide.

18. The transition of claim 1, wherein said waveguide has a length of at least 0.25 mm.

19. The transition of claim 1, wherein said support plate is rigid.

20. The transition of claim 1, wherein said support plate is metal.

21. The transition of claim 1, wherein said support plate is at least 1mm thick.

22. An ACC system comprising the transition of claim 1.

23. A method for transmitting a mm-wave signal from a first plane to a second plane using a transition, method comprising:

providing a transition for transmitting a mm-wave signal from one plane to another, said transition comprising:

first and second transmission lines on parallel planes;

waveguide orthogonal to said first and second transmission lines, wherein said first and second transmission lines are suitable for transmitting a TEM mode signal and said waveguide is suitable for transmitting a waveguide mode signal; a support plate between said first and second transmission lines, said support plate defining a borehole with conductive walls between said first and second transmission lines;

a metalized dielectric filler comprising at least one conductive layer and being disposed in said borehole such that said conductive layer and at least a portion of said conductive walls of said borehole form said waveguide, whereby said waveguide is smaller than said borehole;

transmitting a mm-wave signal along said first transmission line;

converting said signal from a TEM mode a waveguide mode using a transducer;

transmitting said signal along said waveguide in said waveguide mode to a second plane parallel to said first plane;

converting said signal back to said TEM mode; and transmitting said signal in said TEM mode along said second transmission line in said second plane.

24. The method of claim 23, wherein said signal is between about 65 to about 85 GHz.

25. The method of claim 23, wherein the reflective loss is better than 15 dB and the insertion loss is better than 0.6 dB.

26. The method of claim 23, wherein the length of said wave guide is greater than 10% of the wavelength of said signal.

* * * * *